(12) United States Patent
Frost et al.

(10) Patent No.: US 6,977,219 B2
(45) Date of Patent: Dec. 20, 2005

(54) SOLVENT VAPOR-ASSISTED PLASTICIZATION OF PHOTORESIST FILMS TO ACHIEVE CRITICAL DIMENSION REDUCTION DURING TEMPERATURE REFLOW

(75) Inventors: Rex K. Frost, Hillsboro, OR (US); Swaminathan Sivakumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 19 days.

(21) Appl. No.: 10/749,739

(22) Filed: Dec. 30, 2003

(65) Prior Publication Data

US 2005/0148169 A1    Jul. 7, 2005

(51) Int. Cl.⁷ ......................................... H01L 21/4763
(52) U.S. Cl. .................. 438/637; 438/660; 438/663
(58) Field of Search .............................. 438/637, 638, 438/640, 646, 660, 663, 651

(56) References Cited

U.S. PATENT DOCUMENTS 6,210,868 B1 *    4/2001   Yoshii ......................... 430/325
6,485,895 B1 *   11/2002   Choi et al. ................... 430/330

* cited by examiner

*Primary Examiner*—Phuc T. Dang
(74) *Attorney, Agent, or Firm*—Blakely, Sokoloff, Taylor & Zafman LLP

(57) ABSTRACT

The present invention relates to the reduction of critical dimensions and the reduction of feature sizes in manufacturing integrated circuits. Specifically, the method controls photoresist flow rates to develop critical dimensions beyond the resolution limits of the photoresist material used, and the limits of lithographic tool sets. The post exposure and developed resist pattern is exposed to a solvent prior to a bake or reflow process. Exposure to the solvent lowers the molecular weight of the resist material, modifying the resist material's reflow rate. The post-exposure resist is then easier to control during a subsequent reflow process to reduce the hole or line size of the patterned resist.

30 Claims, 5 Drawing Sheets

SOLVENT VAPOR-ASSISTED PLASTICIZATION OF PHOTORESIST FILMS TO ACHIEVE CRITICAL DIMENSION REDUCTION DURING TEMPERATURE REFLOW

FIELD

The present invention relates to the field of manufacturing of integrated circuits and more specifically to the reduction of patterned openings and lines in a resist layer to improve the critical dimension and reduce integrated circuit feature sizes.

BACKGROUND

The effort to build integrated circuits with more and faster semiconductor devices has a resulted in a continued shrinking of the devices within an integrated circuit. This corresponds to a reduction in the size and spacing of the individual transistors and interconnections in an integrated circuit. In many applications, the switching speed and size of the switching devices are functions of the critical dimension of the MOS transistor gate and interconnections to each device. Narrower or smaller device geometries tend to produce a higher performance or faster switching transistor. For example, in circuits having MOS switching devices, a very important process step is the formation of the gate for each transistor and the formation of the interconnection paths to connect each device to form, for example, a processor integrated circuit.

The continued reduction in integrated circuit geometry sizes improves the functionalities and pricing of the integrated circuit, however, the reduction in geometry sizes continues to challenge process designers and manufacturers. The limitations of conventional lithographic techniques used to pattern transistor gates and interconnects are quickly being realized. Accordingly, there is a continuing need for more efficient and effective fabrication processes for forming transistor gates and interconnects that are smaller and/or exhibit higher performance.

In conventional lithographic techniques, the surface of a silicon substrate wafer is coated with a light sensitive photoresist material. Once the photoresist material is formed on the surface of the silicon substrate, the wafer is aligned and the photoresist is exposed using a photo mask and a high intensity light source. The photo resist is developed, and the excess or unwanted photo resist is removed. The remaining photo resist forms a patterned mask over the surface of the silicon substrate, and is usually subjected to a baking or heating process to harden the photoresist and improve its adhesion to the surface of the underlying substrate. The patterned photoresist mask then allows the silicon surface to be exposed to an etching compound to form the features of the switching devices and interconnects in the integrated circuit.

The patterned mask has characteristic qualities and limitations with regard to its ability to maintain a uniform thickness across the substrate wafer, its adhesion qualities to the substrate surface, and its ability to uniformly maintain critical dimensions transferred to it through the formation, mask exposure, development, baking, and etch processes. Design and process engineers must weigh a multitude of factors in reducing the critical dimensions in the fabrication process. Factors relating to the photoresist include thickness uniformity, the ability to hold a pattern, proximity effects during the baking process, and etch resistance. These factors and others effectively define the resolution limit of the photoresist materials.

A critical dimension in the photoresist that is narrower than the photoresist resolution limit is generally incapable of providing an effective mask in the fabrication of a gate or interconnect. The results of using narrow dimensions beyond the resolution limit of the photoresist includes pattern collapse, bending, and pattern closures caused by proximity effects during the baking or reflow process. In addition, attempts to reduce the critical dimension by heating the resist to reflow, results in resist openings closing where openings are less dense or isolated in the resist mask pattern.

In particular in the example shown in FIG. 1A, the structure 100, is based on a substrate 110, the dielectric layer 120, and a photoresist layer that has been subjected to the normal spin, exposure, development, and wash processes 130. The photoresist mask 130, contains an opening 150, and 151, in close proximity and an isolated opening 152. In a standard procedure following the exposure and development of a photoresist a baking step is normally used to harden the photoresist and to improve adhesion to the surface of the substrate. Heating the resist material to reflow might be used to reduce the critical dimension of the photoresist pattern. However, holes and line patterns in the photoresist do not shrink or expand at the same rate. Heating the photoresist to reflow causes the resist to migrate at a rate that is difficult to control and some openings in the photoresist layer close. The problem also occurs when the density of openings varies. In areas of the photoresist mask where holes are isolated, the proximity effect and the photoresist reflow causes the isolated opening to collapse and close. This is illustrated in FIG. 1B showing an isolated opening 162 that has closed while resist openings 160 and 161 do not collapse. The loss of the opening 162 is an unacceptable result.

DETAILED DESCRIPTION

Described is a method for controlling a photoresist layer during a reflow process to develop critical dimensions beyond the resolution limit of the photoresist material, and to overcome problems associated with varying hole and line densities. After the photoresist film has been applied to a substrate, exposed, and developed, the patterned resist is exposed to a solvent or combination of solvents. The infusion of the solvent into the resist layer adds a lower molecular weight molecule to the molecular weight of the resist material, resulting in an overall reduction to the molecular weight of the resist material. A modification of the photoresist material's molecular structure does not occur. A patterned resist layer, after having been exposed to a solvent or a combination of solvents, is subsequently subjected to thermal reflow by heating the photoresist to or beyond its post-exposure glass transition temperature.

Figure 1A:
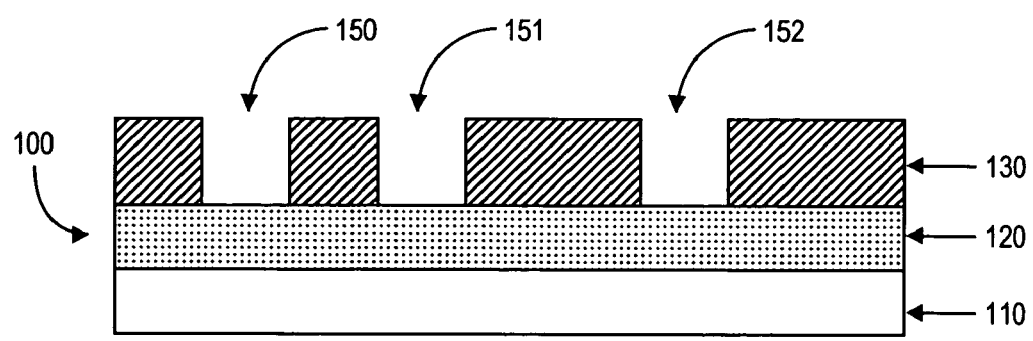
FIG. 1A illustrates a cross sectional view of a prior art patterned resist layer formed above a dielectric layer of a substrate.
Figure 1B:
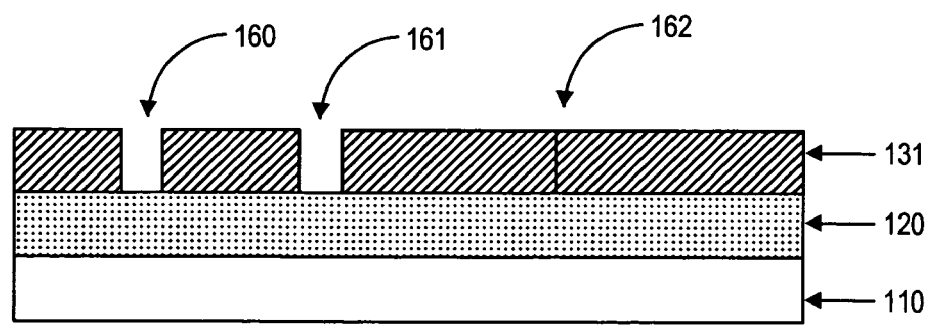
FIG. 1B illustrates a cross sectional view of the patterned resist of FIG. 1A after reflow.
Figure 2A:
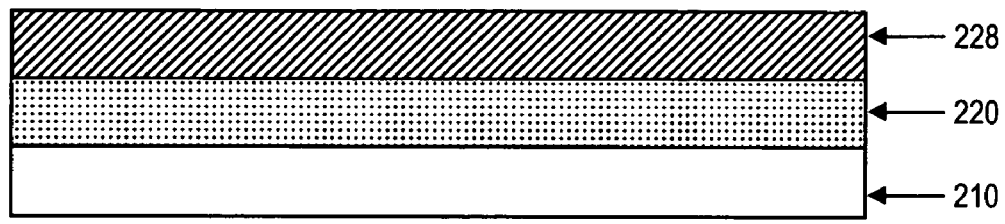
FIG. 2A illustrates an underlying substrate with an inter level dielectric layer formed above the substrate.

In one embodiment, as show in FIG. 2A, an underlying substrate 210 contains formed switching devices, with an inter level dielectric layer 220 formed above the substrate in preparation for forming conductive interconnects. However, in other embodiments, the underlying substrate may contain partially formed switching devices with the intent of forming features to the partially formed devices. After a photoresist layer 228, is formed or spun above a substrate 220, in FIG. 2B, the photoresist layer is exposed, developed, and further processed to remove any unwanted resist or contaminants to develop a patterned resist mask 230. In one embodiment, a post development soft bake process, executed below the resist glass transition temperature, is not employed. In another embodiment, the patterned resist may be subject to a post development soft bake process as a dehydration step, executed below the glass transition temperature for the particular resist material being used.

Figure 2B:
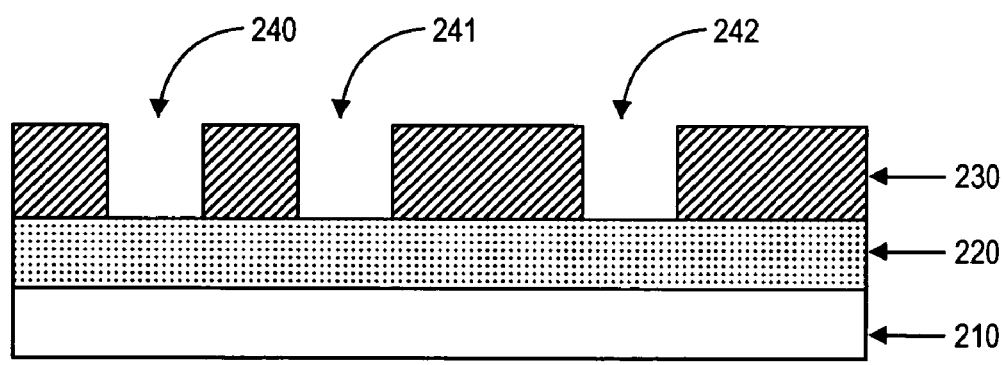
FIG. 2B illustrates an exposed photoresist layer formed or spun above the substrate illustrated in FIG. 2A.

In one embodiment, a 193 nm sensitive resist material, is used. However, a variety of standard resist materials may be used, for example, any chemically amplified or non-chemically amplified resist material, such as I-line, ArF, EUV, or resists sensitive to 248 nm, 193 nm, or 157 nm light sources. Typical 193 nm resists include acrlyate, methacrylate and other hybrids. Also, the geometry size does not particularly matter, and it is possible to implement the process using 248 nm geometries or smaller. As shown in FIG. 2B, the patterned photoresist 230, with openings 240, 241, and 242 would have acted as a mask to expose the underlying substrate 220 to an etch process. However, smaller openings are desired.

Figure 2C:
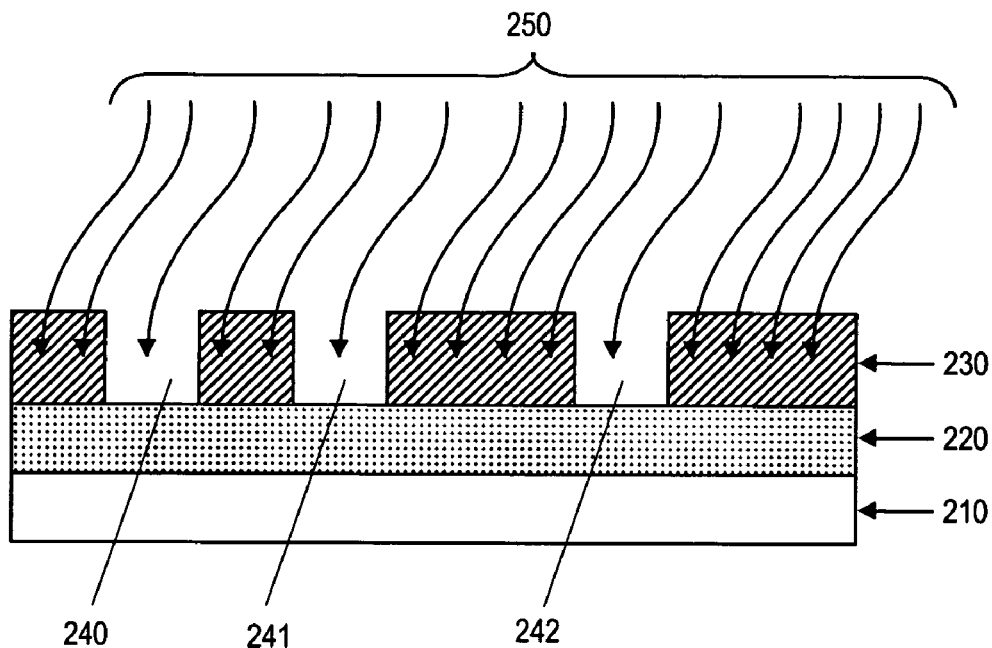
FIG. 2C illustrates a cross sectional view of a patterned resist layer formed above a dielectric layer of a substrate, being exposed to a solvent.

Next, the patterned resist layer may be exposed to a gas, vapor, mist, or liquid, to fully or partially infuse a solvent into a patterned resist layer. In FIG. 2C, the photoresist layer is exposed to a solvent vapor, or a combination of vaporized solvents 250. Various solvents may be used, including solvents that are used in a lithography process. The solvent should be at least partially or fully permeate the patterned resist film 230 and have a lower molecular weight in comparison to the resist material. The molecular weight of the solvent can be similar to the resist in the case of surfactants or 2 orders of magnitude smaller than the resist in the case of simple solvents. Examples of resist solvents include surfactants for example glycerol monostearate, polyoxyethylene cetyl ether, 9-octadecenoic acid, relatively low polarity solvents, for example: dichloro-methane, acetonitrile, isopropanol,or low-MW polymers for example Teflon, polystyrene, or polyethylene.

In one embodiment, a patterned photoresist layer is exposed to a gas or vapor using a Propylene Glycol Monomethyl Ether Acetate (PGMEA) solvent. A vapor is implemented by bubbling Nitrogen (N2) through the liquid solvent at a flow rate of approximately 3 liters per minute, at room temperature, for between 30 seconds to 2 minutes. However, the resulting pressure may be increased by increasing the temperature of the gas or solvent. Although the above embodiment is diluted with Nitrogen, the gas solvent used may also be pure.

In another embodiment, a patterned photoresist layer is exposed to a liquid solvent. The resist layer may be immersed into a liquid containing a solvent or solvent combination. The liquid exposure employs a solvent or resist plasticizer that is dissolved at a 0.1 to 3 percent (%) concentration, into a secondary liquid in which the resist film is not soluble. Alternate embodiments may include higher concentrations. The resist is then exposed for between 30 seconds to 2 minutes to the solvent via mass transport through the secondary liquid phase interface.

In the embodiments described, a variety of resist materials may be used, and the exposure parameters may vary outside of the above ranges depending on the individual and specific photoresist that is being used and the interaction of the various parameters such as pressure and temperature. However, the general formula for one embodiment may be easily changed to vary the exposure of a photoresist material to a solvent or solvent combination.

From the exposure, the solvent partially or fully diffuses, migrates, penetrates, or infuses into the patterned photoresist layer. The resist material, as a result of the solvent exposure, has a lower overall molecular weight of the resist film by approximately 10 to 30 percent. The change in the overall molecular weight of the film results in a modification of the photoresist's reflow response characteristics, independent of the pitch of the patterned resist.

Next, the photoresist layer is heated to or beyond the post exposure glass transition temperature of the photoresist material to reflow. A subsequent reflow decreases the opening dimensions printed in the photoresist film. Executing a reflow step provides a reduction of the critical dimension to below the resolution of a lithographic tool set or below the photoresist fundamental resolution. Modifying the photoresist reflow characteristics results in improved control over the rate that the resist collapses or flows into the patterned photoresist openings. For example, a modification to the resist's overall molecular weight reduces the variability of the closure rate which originally depends upon pitch of the openings in the photoresist. In one embodiment, the exposure of a photoresist material to an electron beam subsequently followed by a thermal reflow process modifies the observed reflow magnitude response of the photoresist by approximately 10 to 15 percent. A reduction in the resist closure variability reduces the probability of closure for an opening in the resist pattern.

Figure 2D:
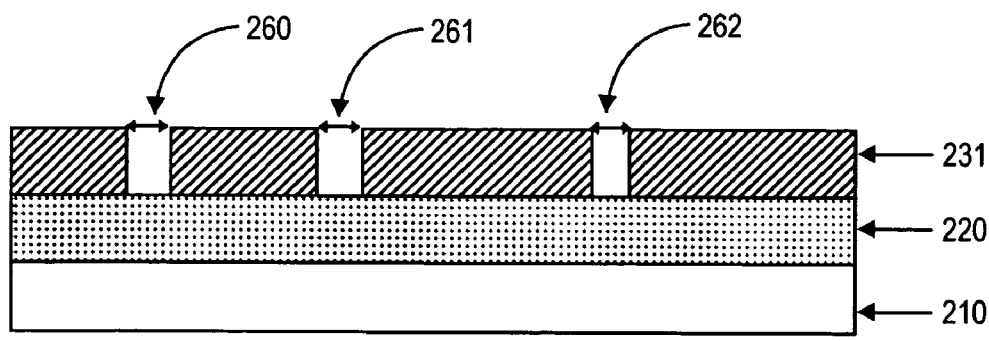
FIG. 2D illustrates a cross sectional view of the patterned resist layer of FIG. 2C after reflow.

FIG. 2D illustrates a substrate 210, and the photoresist pattern 231, after having been exposed to a solvent and heated to or beyond the glass transition temperature as described in the above process. The openings 260 and 261, and the isolated opening 262, have a reduced opening size in comparison to the non-exposed resist patterns 240, 241, and 242 shown in FIG. 2C. In FIG. 2D, the solvent exposed resist layer results in improved uniform opening sizes without closure or collapse. The isolated opening 262, exhibits a shrink percentage that is similar to the shrink rate of the non-isolated openings 260 and 261. However, other reductions may be achieved using the method described. The same resist, having not been exposed would exhibit an increased frequency of closures to the isolated opening from the resist material's proximity effect.

Appropriate reflow temperature ranges are primarily governed by the glass transition temperature (Tg) of the resist material as modified by an exposure as described above. In one embodiment, using a Methacrylate resist material, the photoresist is heated to a temperature between 125 to 175 degrees Centigrade for 60 to 90 seconds. In other embodiments, the temperatures and times for heating the photoresist layer to reflow maybe within or outside of the above ranges, depending on the individual characteristics of the photoresist being used and the solvent exposure parameters. Generally, a more effective plasticization, or higher degree of solvent exposure will reduce the required reflow temperature.

Exposure of the photoresist material to the solvent, subsequently followed by a thermal reflow process modifies the observed reflow magnitude response of the photoresist. For a patterned photoresist layer that has been exposed to a solvent using the above method, compared to photoresist that has not been exposed, the exposed photoresist will exhibit a more uniform shrinkage rate of openings in the photoresist. The exposure, having modified the resist material to create a more uniform shrinkage characteristic, provides the ability to control the shrinkage rate during a subsequent resist reflow process to reduce the critical dimension of a resist pattern.

In general, pure acrylate resists are expected to have a glass transition temperature (Tg) appropriate for thermal reflow, but typically have a less competitive lithographic resolution. Resists with more methacrylate character typically have better lithographic performance but have a relatively high Tg. In one embodiment, a single resist was used, but final optimized solutions would normally employ different resins. It is not expected that one solution would necessarily provide a lower fundamental critical dimension (CD) limit than another.

Figure 2E:
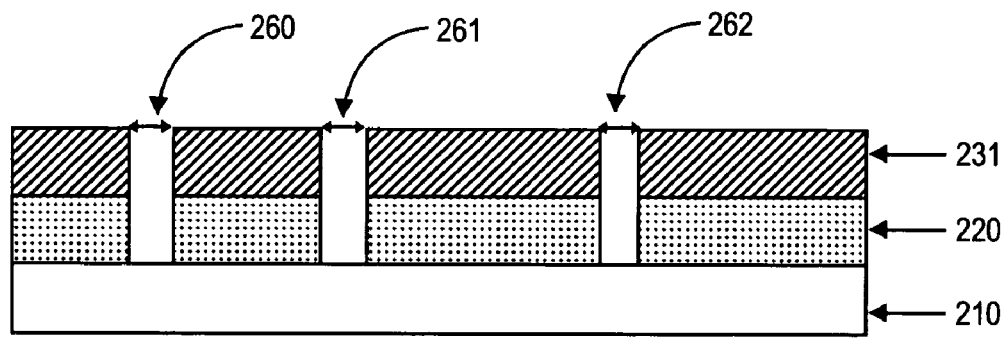
FIG. 2E illustrates a cross sectional view of FIG. 2D after etch.

Using the above exposure method, a decrease in a critical dimension in a patterned resist layer in preparation for a subsequent etch process may be achieved. A variety of etch techniques are applicable, such as a wet or gaseous chemical or isotropic etch, or a dry plasma, reactive ion, or anisotropic etch to either develop device interconnections or to develop features of a switching device such as an MOS transitor. In FIG. 2E, the etch process creates openings 263, 264, and 265, in dielectric layer 221 that are smaller than the resist openings produced by a lithographic tool set, or the fundamental resolution of the photoresist, as illustrated in FIG. 2B as 240, 241, and 242. The etch process may be used to form the openings for conductive interconnections between electronic or digital switching devices or to form the feature of an electronic or digital switching device.

Figure 3:
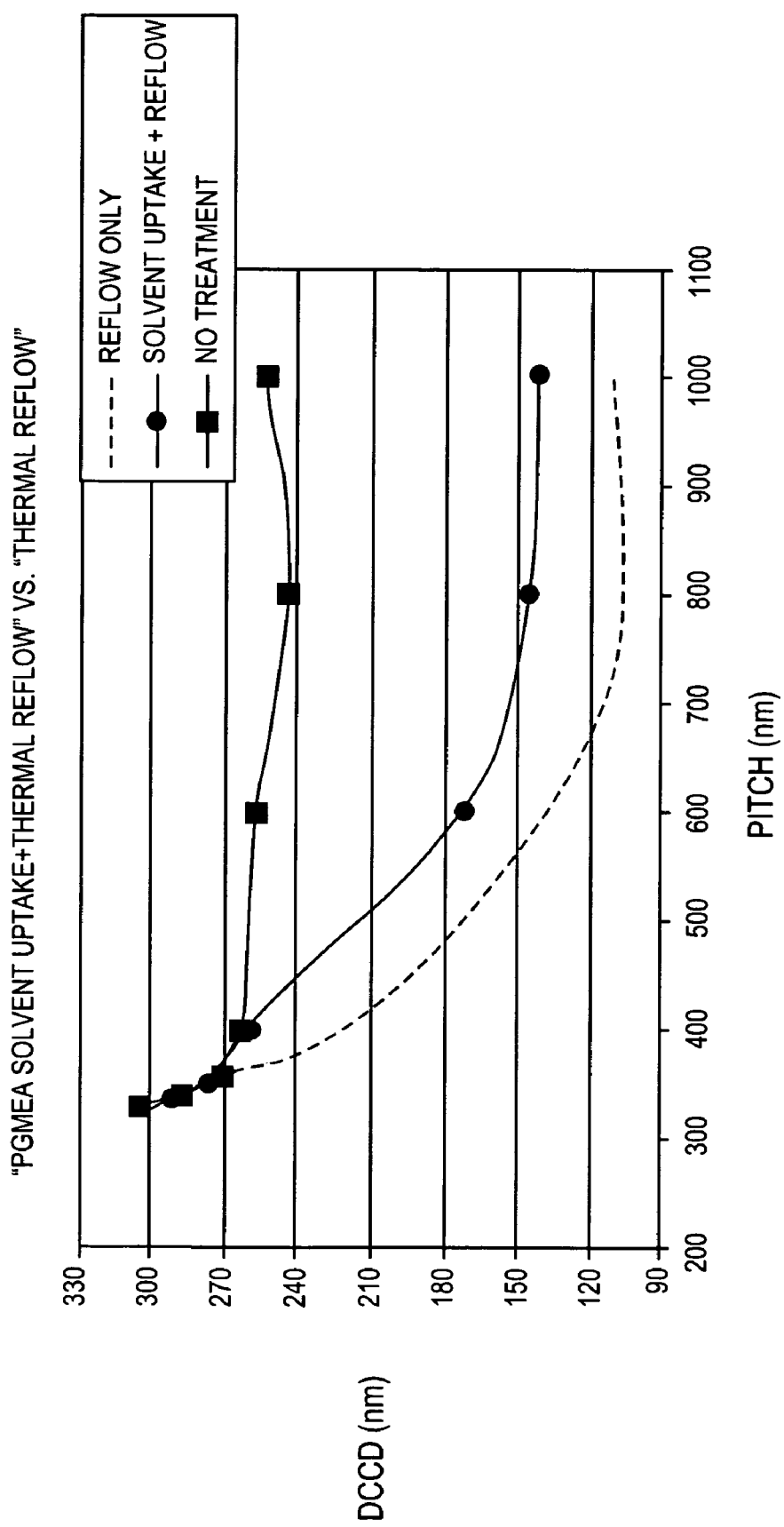
FIG. 3 shows a chart of resist film contact hole diameter DCCD (develop check critical dimension) reduction versus pitch. Solvent exposed resist reflow is compared to reflow of resist without exposure.

FIG. 3 shows the resulting characteristics for a resist material, charting contact whole diameter DCCD (develop check critical dimension) vs. pitch. A resist material that has been exposed to a solvent and heated to thermal reflow is compared to the same resist material that has been reflowed only and to the same resist material that has been subjected to only a standard lithography process. In FIG. 3, the "no treatment" data points and curve represent resist material that has been subjected to a standard lithography process, without reflow or exposure to a solvent. The "no treatment" curve is compared to the same resist material that has also been subjected to heating to achieve reflow, which is shown as "reflow only." The "reflow only" data appears as a dashed line. The third item being compared is the "solvent uptake+reflow" data points and curve which represents the same resist material that has also been exposed to a solvent and then subjected to reflow.

In FIG. 3, the "solvent uptake+reflow" curve has a different response and characteristic in comparison to the "no treatment" and "reflow only" samples. The curves in FIG. 3 indicate that exposing a resist to a solvent will mitigate pitch related proximity or closure problems with a resist material when the resist film reflows and shrinkage occurs. The change in response for the photoresist material that has been exposed to a solvent provides an improved critical dimension. Using the solvent exposure method, an opening in a resist pattern may be decreased to improve a critical dimension or to decrease line widths. The "no treatment" resist has a constant and linear curve with respect to whole diameter vs. pitch. However, the "no treatment" resist is limited by the critical dimensions of the lithography process used and the photoresist resolution. As shown in the curve that limit is approximately 250 nm for the particular resist material being used.

In FIG. 3, the "reflow only" resist indicates that it might be used as a method to decrease the critical dimension of the patterned resist layer. However, the response of the "reflow only" resist creates problems such as collapse and closure of patterned openings and lines. The increased speed in reflow and variability indicates a high probability of a proximity effect closure of a photoresist opening. For the "reflow only" resist, a critical dimension reduction is more difficult to control at a tighter pitch. The data and curve for the "reflow only" resist indicates that the reflow rate is faster in comparison to the resist material that has been exposed to a solvent. The same photoresist material that has been exposed to a solvent will exhibit a moderated reflow response in comparison to a resist that is reflowed only. The moderation of the resist reflow response provides the development of a better critical dimension without the probability of collapse or closures in the resist pattern.

Exposing a resist material to a solvent creates a variety of reflow responses, providing the advantages of decreasing critical dimensions without an increase in the probability of closures or collapse. In FIG. 3, the "solvent uptake+reflow" curve lies between the "reflow only" curve and the "no treatment" curves. However, exposure to a solvent may be used to vary the reflow response of a resist material beyond, above or below, either the reflow only curve or the no treatment curve depending on the solvent being used in the exposure. Although the examples described above are for openings in the photoresist pattern, but the same method and principles may be used to also modify the characteristics of photoresist pattern lines.

In the described method above, a photoresist material has been shown to provide a variety of reflow responses related to an exposure process. The process of exposing a patterned photoresist layer to a solvent or combination of solvents may be used to modify the thermal response or reflow characteristics of a resist material to control the rate in which openings or lines shrink, ultimately controlling at least one critical dimension in a semiconductor or integrated circuit manufacturing process.

Alternate embodiments of the invention may provide the ability to modulate and control the shrinkage characteristics of a variety of resist materials. Although the embodiments described may represent specific resist materials subjected to specific exposure parameters, using alternate resists, other solvents or combination of solvents, and alternate exposure parameters will provide similar beneficial modifications to the resist reflow response. In addition, a particular resist material may be matched to a desired thermal cycle to keep the resist layer below a degradation point.

Using the above exposure method, a decrease in a critical dimension in a patterned resist layer in preparation for a subsequent etch process may be achieved. A variety of etch techniques are applicable, such as a wet or gaseous chemical or isotropic etch, or a dry plasma, reactive ion, or anisotropic etch to either develop device interconnections or to develop features of a switching device such as an MOS transitor. In FIG. 2E, the etch process creates openings 263, 264, and 265, in dielectric layer 220 that are smaller than the resist openings produced by a lithographic tool set, or the fundamental resolution of the photoresist, as illustrated in FIG. 2B as 240, 241, and 242. The etch process may be used to form the openings for conductive interconnections between electronic or digital switching devices or to form the feature of an electronic or digital switching device.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. In other instances well-known semiconductor fabrication processes, techniques, materials, equipment, etc., have not been set forth in particular detail in order to not unnecessarily obscure the present invention.

What is claimed is:

1. A method for controlling a photoresist layer above a substrate comprising:
   forming, exposing, and developing a photoresist layer forming at least one opening having a first dimension;
   exposing the photoresist layer with the at least one opening to a solvent, wherein exposing the photoresist layer with the at least one opening to a solvent causes a mitigation of bulk expansion of the photoresist layer during reflow; and
   heating the photoresist layer with the at least one opening, after exposing the photoresist layer to the solvent, to achieve a thermal reflow of the photoresist layer to modify the dimension of the at least one opening in the photoresist layer.

2. The method of claim 1 wherein the solvent is a gas, vapor, mist, or liquid.

3. The method of claim 1 wherein heating the photoresist layer with the at least one opening to achieve a thermal reflow controls the formation of a critical dimension that is less than the resolution of a lithographic tool set.

4. The method of claim 1 wherein heating the photoresist layer with the at least one opening to achieve a thermal reflow controls the formation of a critical dimension that is less than the fundamental resolution of the photoresist layer.

5. The method of claim 1 wherein controlling the heating of the photoresist layer to modify the dimension of the at least one opening in the photoresist layer decreases the dimension of the opening in the photoresist layer.

6. A method for controlling a photoresist layer above a substrate comprising:
   forming, exposing, and developing the photoresist layer forming at least one opening having a first dimension;
   exposing the photoresist layer with the at least one opening to a solvent; wherein exposing the photoresist layer with the at least one opening to a solvent causes a mitigation of bulk expansion of the photoresist layer during reflow; and
   heating the photoresist layer with the at least one opening, after exposing the photoresist layer to the solvent, to achieve a thermal reflow of the photoresist layer to decrease the dimension of the at least one opening in the photoresist layer.

7. The method of claim 6 wherein the solvent is a surfactant.

8. The method of claim 6 wherein the solvent is selected from the group glycerol monostearate, polyoxyethylene cetyl ether, and 9-octadecenoic acid.

9. The method of claim 6 wherein the solvent is a relatively low polarity solvent.

10. The method of claim 9 wherein the solvent is selected from the group dichloro-methane, acetonitrile, and isopropanol.

11. The method of claim 6 wherein the solvent is a low-molecular weight polymer.

12. The method of claim 11 wherein the solvent is a selected from the group Teflon, polystyrene, and polyethylene.

13. The method of claim 6 wherein the solvent is a gas or vapor.

14. The method of claim 13 wherein the photoresist layer with the at least one opening is exposed to a solvent for between 30 seconds and 2 minutes prior to heating the photoresist to reflow.

15. The method of claim 13 wherein the exposure is approximately at room temperature.

16. The method of claim 13 wherein the solvent is a Propylene Glycol Monomethyl Ether Acetate (PGMEA) solvent.

17. The method of claim 13 wherein the gas solvent is implemented by bubbling N2 through the liquid solvent at a flow rate of approximately 3 liters per minute, at room temperature, for between 30 seconds to 2 minutes.

18. The method of claim 6 wherein the solvent is a liquid.

19. The method of claim 6 wherein the photoresist layer with the at least one opening is exposed to a solvent for between 30 seconds and 2 minutes prior to heating the photoresist to reflow.

20. The method of claim 19 wherein the solvent is dissolved at a 0.1 to 3 percent (%) concentration.

21. The method of claim 19 wherein the solvent is dissolved into a secondary liquid in which the resist film is not soluble.

22. The process of claim 6 wherein controlling the heating is performed at a temperature between 125 to 165 degrees Centigrade.

23. The process of claim 6 wherein controlling the heating is performed for 60 to 90 seconds.

24. The process of claim 6 wherein controlling the heating controls the formation of a photoresist layer critical dimension.

25. A substrate having an etched feature having been formed by a process comprising:
   forming, exposing, and developing a photoresist layer above a substrate forming at least one opening having a first dimension;
   exposing the photoresist layer with at least one opening to a solvent wherein exposing the photoresist layer with the at least one opening to a solvent causes a mitigation of bulk expansion of the photoresist layer during reflow; and
   heating the photoresist layer with at least one opening, after exposing the photoresist layer to the solvent, to achieve a thermal reflow of the photoresist layer,
   and subjecting the photoresist layer with at least one opening to an etch process, subsequently forming an integrated circuit feature.

26. The solvent of claim 25 wherein the solvent is a surfactant, relatively low polarity solvent, or a low-molecular weight polymer.

27. The solvent of claim 25 wherein the solvent is a Propylene Glycol Monomethyl Ether Acetate (PGMEA) solvent.

28. The heating the photoresist layer with the at least one opening of claim 25 wherein heating the photoresist layer with the at least one opening to achieve a thermal reflow controls the formation of an etch ready critical dimension.

29. The heating the photoresist layer with the at least one opening of claim 25 wherein heating the photoresist layer with the at least one opening to achieve a thermal reflow controls the formation of an etch ready critical dimension that is less than the resolution of a lithographic tool set.

30. The heating the photoresist layer with the at least one opening of claim 25 wherein heating the photoresist layer with the at least one opening to achieve a thermal reflow controls the formation of an etch ready critical dimension that is less then the fundamental resolution of the photoresist layer.

* * * * *

UNITED STATES PATENT AND TRADEMARK OFFICE
CERTIFICATE OF CORRECTION

PATENT NO. : 6,977,219 B2
APPLICATION NO. : 10/749739
DATED : June 5, 2006
INVENTOR(S) : Neiger et al.

It is certified that error appears in the above-identified patent and that said Letters Patent is hereby corrected as shown below:

In column (8), Claim 11 at line 8, delete "a".

In column (8), Claim 22 at line 38, delete "165" and insert -- 175 --.

Signed and Sealed this

Sixth Day of March, 2007

JON W. DUDAS
*Director of the United States Patent and Trademark Office*

UNITED STATES PATENT AND TRADEMARK OFFICE
CERTIFICATE OF CORRECTION

PATENT NO. : 6,977,219 B2  Page 1 of 1
APPLICATION NO. : 10/749739
DATED : December 20, 2005
INVENTOR(S) : Neiger et al.

It is certified that error appears in the above-identified patent and that said Letters Patent is hereby corrected as shown below:

In column (8), Claim 11 at line 8, delete "a".

In column (8), Claim 22 at line 38, delete "165" and insert -- 175 --.

This certificate supersedes Certificate of Correction issued March 6, 2007.

Signed and Sealed this

Twenty-seventh Day of March, 2007

JON W. DUDAS
*Director of the United States Patent and Trademark Office*